(12) United States Patent
Takagi

(10) Patent No.: US 6,594,185 B1
(45) Date of Patent: Jul. 15, 2003

(54) WRITE-INHIBIT CIRCUIT, SEMICONDUCTOR INTEGRATED CIRCUIT USING THE SAME, INK CARTRIDGE INCLUDING THE SEMICONDUCTOR INTEGRATED CIRCUIT, AND INK-JET RECORDING APPARATUS

(75) Inventor: Tetsuo Takagi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/857,471
(22) PCT Filed: Oct. 4, 2000
(86) PCT No.: PCT/JP00/06936
§ 371 (c)(1), (2), (4) Date: Jul. 26, 2001
(87) PCT Pub. No.: WO01/26116
PCT Pub. Date: Apr. 12, 2001

(30) Foreign Application Priority Data

Oct. 4, 1999 (JP) .......................................... 11-283244

(51) Int. Cl.[7] ................................................ G11C 7/00
(52) U.S. Cl. .................................. 365/195; 365/189.01
(58) Field of Search .......................... 365/195, 189.01, 365/189.08, 196, 207

(56) References Cited

U.S. PATENT DOCUMENTS 4,853,892 A * 8/1989 Hori ...................... 365/189.08
5,016,222 A   5/1991 Hashimoto
5,369,614 A * 11/1994 Miyanishi .............. 365/189.01
5,381,366 A *  1/1995 Kawauchi et al. ..... 365/185.04

FOREIGN PATENT DOCUMENTS

| EP | 0 549 374   | 6/1993  |
|----|-------------|---------|
| EP | 0 593 282   | 4/1994  |
| JP | 05-301349   | 11/1993 |
| JP | 06-180998   | 6/1994  |
| JP | 09-116665   | 5/1997  |
| JP | 09-213092   | 8/1997  |

* cited by examiner

Primary Examiner—Richard Elms
Assistant Examiner—Anh Phung
(74) Attorney, Agent, or Firm—Rosalio Haro

(57) ABSTRACT

Chip area and operating current is reduced in a chip having a write-inhibit circuit that uses a data-writing request signal WR and a write-control signal WRITE to inhibit data writing. By comparing a reference current Iref and a drive current ID, a current-mirror circuit CM can monitor the voltage of a power supply VDD. When the voltage of the power supply VDD is sufficiently high, the data-writing request signal WR is unchanged. Conversely, when the voltage of the power supply VDD is not sufficiently high, a transistor T6 producing reference-current $I_D$ and a buffer B2 cause the write-control signal to be low "L" irrespective of whether the data-writing request signal WR is at "H" or at "L". Thus, miswriting can be prevented when the power-supply voltage decreases, since writing by the data-writing request signal WR is impossible.

14 Claims, 13 Drawing Sheets

WRITE-INHIBIT CIRCUIT, SEMICONDUCTOR INTEGRATED CIRCUIT USING THE SAME, INK CARTRIDGE INCLUDING THE SEMICONDUCTOR INTEGRATED CIRCUIT, AND INK-JET RECORDING APPARATUS

BACKGROUND OF THE INVENTION

1. Technical Field

The present invention relates to a write-inhibit circuit for use in a semiconductor integrated circuit including a nonvolatile memory, an ink cartridge 10 including the semiconductor integrated circuit, and an ink-jet recording apparatus in which the ink cartridge is mounted.

2. Background Art

Conventionally, in a case in which a power-supply voltage decreases due to some cause when the desired data is written in a nonvolatile memory built into a semiconductor integrated circuit, miswriting may be performed. To prevent the miswriting, a write-inhibit circuit may be provided in the semiconductor integrated circuit.

FIG. 13 is a block diagram showing an example of a write-inhibit circuit built into a semiconductor integrated circuit. In this figure, a write-inhibit circuit 100 includes a resistor array 101, an operational amplifier 102, a bias circuit 103, a logic gate 104, and a reference-voltage supply 105.

The resistor array 101 is formed by a resistor R1 and a resistor R2 which are connected in series. One end of the resistor R1 is connected to a high-potential power supply VDD. One end of the resistor R2 is connected to a low-potential power supply VSS. By connecting the junction of the resistor R1 and the resistor R2 to the gate of a transistor Q2, a voltage that is divided corresponding to a resistance ratio between the resistor R1 and the resistor R2 is applied to the gate of the transistor Q2.

The operational amplifier 102 is formed such that the transistors Q1 and Q2, which are connected in series, are connected in parallel to transistors Q3 and Q4. The gates of the transistors Q1 and Q3 are connected in common, and are connected to the junction of the transistor Q1 and transistor Q2. The junction of the transistor Q3 and the transistor Q4 is connected as an output end to the gate of a transistor Q6 at the subsequent stage. A reference voltage Vref is applied from the reference-voltage supply 105 to the gate of the transistor Q4.

The bias circuit 103 is provided between a low-potential connection end (the junction of the transistors Q2 and Q4) of the operational amplifier 102 and the low potential power supply VSS, and includes the transistor Q5, which is applied a power-supply voltage Vreg having a predetermined potential, and a transistor Q7 connected in common to the back gate of the transistor Q5.

The logic gate 104 is formed by a NOR gate G11. The NOR gate G11 has one input end to which an inverted signal of a writing request signal WR is input. Also, the junction of the transistor Q6 and the transistor Q7 is connected to the other input end of the NOR gate G11, so that the potential of the junction is input, and an inverted signal of a logical addition of the inputs is output.

In the above-described construction, when the voltage value of the high potential power supply VDD is sufficiently higher than the reference voltage Vref of the reference-voltage supply 105, the output of the operational amplifier 102 is at "L", and the transistor Q6 is in off-state. Then, "L" is applied to the other input end of the NOR gate G11, so that the data-writing request signal WR is unchanged and output as a write-control signal WRITE.

In addition, in a case in which the voltage value of the high potential power supply VDD decreases for some reason, the voltage applied to the transistor Q2, which is divided by the resistor array 101, is less than the reference voltage Vref, the output of the operational amplifier 102 is at "H", so that the transistor Q6 is in on-state.

At this time, "H" is applied to the other input end of the NOR gate G11. Thus, irrespective of whether the data-writing request signal WR is either at "H" or "L", the write-control signal WRITE is at "L". In other words, the power-supply voltage decreases, and miswriting can be prevented because writing by the data-writing request signal WR cannot be performed.

The write-inhibit circuit 100 has a relatively high detection precision since it uses the operational amplifier 102. However, the write-inhibit circuit 100 has the following defects. Specifically, the write-inhibit circuit 100 must include, other than the operational amplifier 102, the resistor array 101, the bias circuit 103, the logic gate 104, and the reference-voltage supply 105. Among these, in particular, the resistor array 101, the logic gate 104, and the reference-voltage supply 105 are large in circuit size. Accordingly, provision of these in the semiconductor integrated circuit causes a drawback in that the chip area increases.

In addition, in order that the write-inhibit circuit 100 may operate, it is required that, by using the bias circuit 103, a current always flow in the operational amplifier 102. This causes a defect in that the operating current increases increasing the power consumption and generated heat increases.

The present invention is made to solve the above defects in the related art, and an object thereof is to reduce a chip area and to provide a write-inhibit circuit in which power consumption is reduced, a semiconductor integrated circuit using the same, an ink cartridge including the semiconductor integrated circuit, and an ink-jet recording apparatus.

Disclosure of Invention

A write-inhibit circuit of the present invention is a write-inhibit circuit using a data-writing request signal as an input and using an output write-control signal to inhibit data writing. The write-inhibit circuit includes a current mirror circuit in which a first transistor array that is formed by connecting in series a plurality of transistors including a depletion transistor, used as a reference-current supply between a high potential power supply and a low potential power supply, is connected in parallel to a second transistor array that is formed by connecting a plurality of transistors between the high potential power supply and the low potential power supply, wherein the write-inhibit circuit leads an output in accordance with the result of comparison between a reference current from the reference-current supply and a current in accordance with the input signal, and when the voltage of the high potential power supply decreases, the write-inhibit circuit leads an output in accordance with the reference current from the reference-current supply.

The second transistor array is formed by connecting in series a first transistor which is connected to the high potential power supply and which is switched on in accordance with the data-writing request signal, a second transistor which allows a current equal to that flowing via the first transistor to flow in the first transistor array, and a third transistor which is switched on together with the first transistor and which forms a current path to the low potential power supply; the first transistor array is formed by connecting in series a fourth transistor which is connected to the high potential power supply and which is switched on in accordance with the data-writing request signal, a fifth transistor having a gate electrode connected in common to the gate terminal of the second transistor, and a sixth transistor as the depletion transistor; and the write-control signal is output from the junction of the fifth transistor and the sixth transistor.

A semiconductor integrated circuit of the present invention includes: the above write-inhibit circuit; a memory cell for storing data at a designated address; and an address generating circuit for sequentially generating addresses for designation in the memory cell. The writing of the data in the memory cell is inhibited based on a write-control signal output from the write-inhibit circuit.

The semiconductor integrated circuit further includes a control means for performing control so as to perform transfer to a low power consumption mode having power consumption less than a normal operating mode for performing a normal operation. The semiconductor integrated circuit may be provided in an ink cartridge, and may perform transfer to the low power consumption mode in response to the termination of a printing operation using the ink cartridge. The address may be initialized when the control means performs transfer to the low power consumption mode.

In the low power consumption mode activated by the control means, the operations of internal circuits are terminated, such as a sense amplifier for generating a signal for reading data stored in the storage means, an address decoder for designating an address in the storage means, a buffer used when data read from the storage means is read, and a latch circuit for latching data read from the storage means.

The transfer to the low power consumption mode, and the initialization of the address generated by the address generating means may be performed based on a control signal input to a common external terminal. The common external terminal is, for example, a chip-select terminal.

An ink cartridge of the present invention includes the above semiconductor integrated circuit, and stores at least the remaining amount of ink.

An ink-jet recording apparatus of the present invention has the above ink cartridge, and uses ink supplied from the ink cartridge to print the desired image information.

BEST MODE FOR CARRYING OUT THE INVENTION

Figure 1:
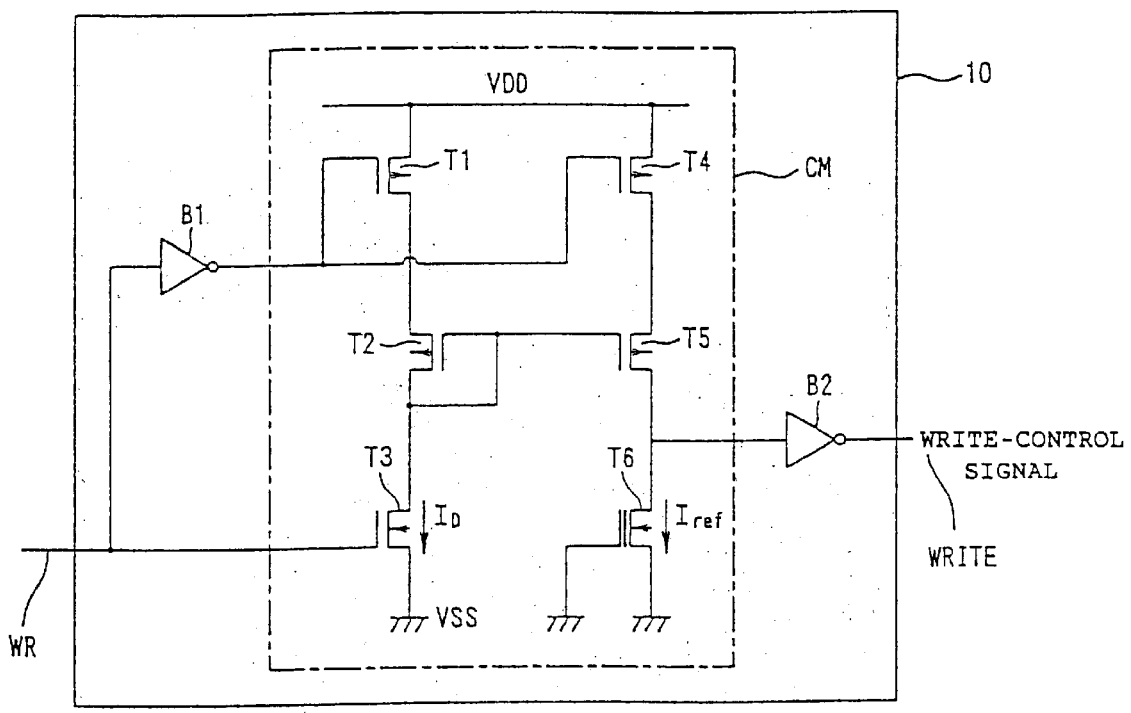
FIG. 1 is a circuit diagram showing an example of a write-inhibit circuit according to an embodiment of the present invention.

Next, an embodiment of the present invention is described with reference to the drawings. In each drawing to be referred in the following description, portions identical to those in other drawings are denoted by identical reference numerals.

FIG. 1 is a showing a write-inhibit circuit according to the embodiment. In this figure, a write-inhibit circuit 10 includes a buffer gate B1, a current-mirror circuit CM, and a buffer gate B2. The current-mirror circuit CM includes a first transistor array of transistors T1 to T3, and a second transistor array of transistors T4 to T6.

Here, the transistors T1 to T5 are enhancement transistors in which, by applying a voltage not less than a threshold value across the gate and the source of each transistor, a channel is formed across the source and the drain of each transistor, causing current flow. The transistor T6 is a depletion transistor in which a current flows across a source and a drain even if a gate voltage is zero.

The buffer gate B1 uses a write-request signal WR as an input, and outputs a signal obtained by inverting and amplifying the input. The output end of the buffer gate B1 is connected to the gate of the transistor T1. The buffer gate B2 inverts and amplifies an output from the current mirror circuit, and outputs the obtained signal as a write-control signal.

The current-mirror circuit CM is formed such that between a high potential power supply VDD and a low potential power supply VSS, a first transistor array formed by connecting in series a P-channel MOS transistor (hereinafter referred to as a P-transistor) T1, a P-transistor T2, and an N-channel MOS transistor (hereinafter referred to as an N-transistor) T3 in this order is connected in parallel to a second transistor array formed by a P-transistor T4, a P-transistor T5, and an N-transistor T6 in this order.

The P transistor T1 has a gate connected to the output end of the buffer gate B1. The gate of the transistor T1 is also connected to the gate of the P-transistor T4. The P-transistor T2 has a gate connected to the gate of the gate of the P-transistor T5, and the connection end is also connected to a junction to the N-transistor T3.

The N-transistor T3 is connected to a signal line to which the write-request signal WR is input. A junction of the P-transistor T5 and the N-transistor T6 is used as an output end of the current-mirror circuit CM, and the output end is connected to the input end of the buffer gate B2. A low potential voltage having a predetermined potential is applied to the gate of the N-transistor T6 so that a reference current Iref flows in the N-transistor T6. In this case, by forming the N-transistor T6 to be of a depletion type, the reference current Iref can flow also in a normal state.

As described above, this write-inhibit circuit is a write-inhibit circuit to which the signal WR for requesting data writing is input and that inhibits data writing by using a write-control signal WRITE to be output. This write-inhibit circuit includes the current-mirror circuit CM formed such that a first transistor array in which a plurality of transistors including a depletion transistor for use in a reference current supply are connected in series between the high potential power supply VDD and the low potential power supply VSS is connected in parallel to a second array of transistors that are connected in series between the high potential power supply VDD and the low potential power supply VSS and that allows a current in accordance with the data-writing request signal WR to flow. The current-mirror circuit CM operates so as to lead an output (the write-control signal WRITE) in accordance with the result of comparing the reference current Iref and an input signal and so as to lead an output in accordance with the reference current Iref when the voltage of the high potential power supply decreases.

The first transistor array is formed by connecting in series the transistor T1, which is connected to the high potential power supply VDD and which is switched on in accordance with the data-writing request signal WR, the transistor T2, which allows a current equal to a current flowing via the transistor T1 to flow in the first transistor array, and the transistor T3, which is switched on simultaneously with the transistor T2 so that a current path to the low potential power supply VSS is formed. Also, the second transistor array is formed by connecting in series the transistor T4, which is connected to the high potential power supply VDD and which is switched on in accordance with the data-writing request signal WR, the transistor T5, which has a gate electrode connected in common to the gate electrode of the transistor T2, and the transistor T6 as a depletion transistor. From a junction of the transistor T5 and the transistor T6, the write-control signal WRITE is output through buffer B2.

In the above-described construction, the current-mirror circuit CM can detect the voltage value of the high potential power supply VDD by comparing the reference current Iref and a current ID flowing across the source and drain of the N-transistor T3. In other words, when the voltage value of the high potential power supply VDD is sufficiently high, the data-writing request signal WR is directly output as a write-control signal. In other words, when the data-writing request signal WR is "L", the write-control signal is "L", and when the data-writing request signal WR is "H", the write-control signal is "H".

In addition, if the voltage value of the high potential power supply VDD decreases due to some reason, the transistor T6 for use in the reference current supply and the buffer gate B2 cause the write-control signal to be "L" irrespective of whether the data-writing request signal WR is "H" or "L". In other words, when the power supply voltage decreases, writing by the data-writing request signal WR cannot be performed, so that miswriting can be prevented.

In other words, the circuit compares a voltage current to be measured and a reference current, performs voltage detection based on the difference current, and inhibits data writing when the detected voltage value is a predetermined voltage value or less. The transistors constituting the circuit are all MOS transistors, and it is clear that they can be easily formed by an ordinary semiconductor production process.

Figure 13:
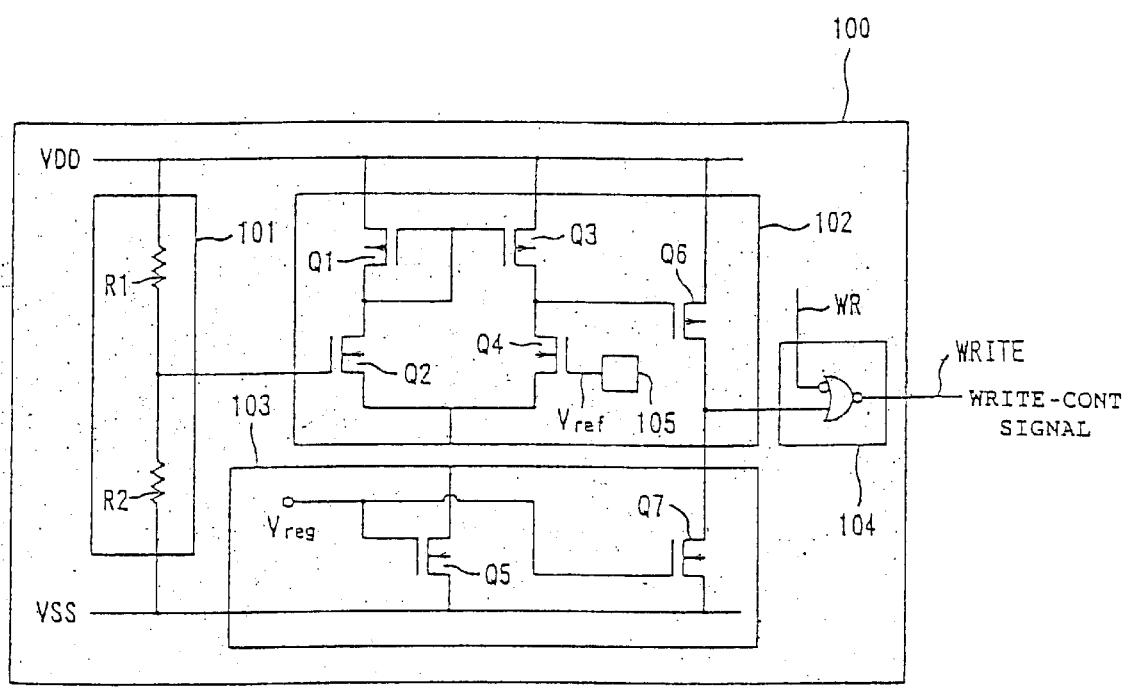
FIG. 13 is a block diagram showing an example of a conventional write-inhibit circuit.

The above basis operation is similar to that in FIG. 13. However, in this embodiment, by using the current-mirror circuit CM to compare the reference current Iref by the reference current supply and the current ID, voltage-detection and write-inhibit circuits can be integrated, so that the circuit size can be reduced. Also, since no operational amplifier and no voltage-dividing resistor are used, the current consumption can be suppressed, and heat generation can be suppressed.

Figure 2:
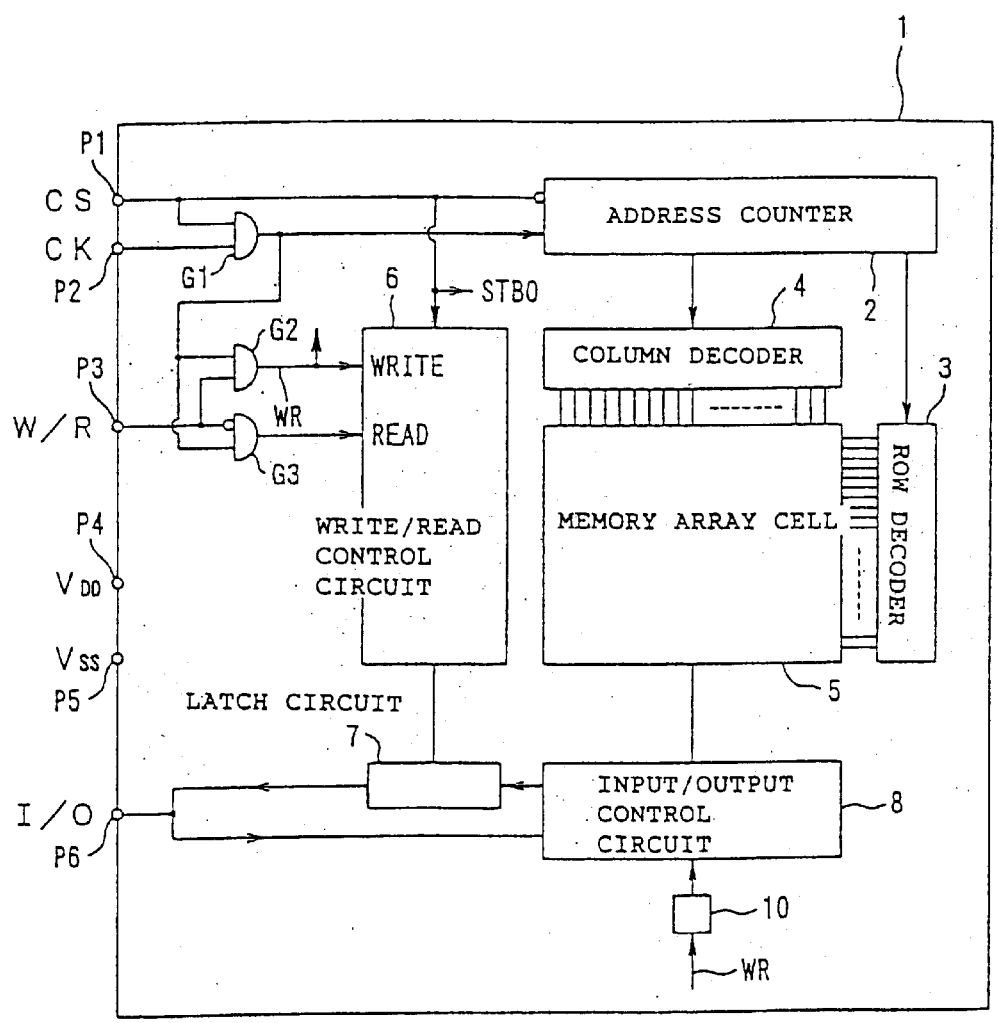
FIG. 2 is a functional block diagram illustrating the internal structure of a semiconductor integrated circuit including the write-inhibit circuit in FIG. 1.

FIG. 2 is a functional block diagram illustrating the internal structure of a semiconductor integrated circuit using the above-described write-inhibit circuit in FIG. 1.

As shown in the figure, a semiconductor integrated circuit 1 includes an address counter 2 for performing a counting operation, a row decoder 3 and a column decoder 4 which each generate an address by decoding the count value from the address counter 2, a memory-cell array 5 for storing data, a write/read control circuit 6 that controls a latch circuit 7 in accordance with writing to or reading from the memory-cell array 5, the latch circuit 7, which is controlled to be in latch-state or through-state by the write/read control circuit 6, an input/output control circuit 8 that controls data input/output with respect to the memory-cell array 5, AND gates G1 to G3, and a write-inhibit circuit 10. The semiconductor integrated circuit 1 is provided with external terminals P1 to P6.

In the address counter 2, the count value is initialized (reset) to a predetermined value, based on an inverted signal of a chip-select input signal CS input from the external terminal P1. The address counter 2 also generates address data updated based on a signal input from the AND gate G1. The generated address data is input to the row decoder 3 and the column decoder 4.

The column decoder 4 selects the desired column of memory cells in the memory-cell array 5 based on the address data input from the address counter 2. Similarly, the row decoder 3 selects the desired row of memory cells in the memory-cell array 5 based on the address data input from the address counter 2.

The memory-cell array 5 is formed by arranging a plurality of memory cells in the form of a grid. Each memory cell is switched on by a selection signal from the row decoder 3, and is set by a selection signal from the column decoder 4 so that reading of information stored in the memory cell and writing can be performed. The memory-cell array 5 consists of nonvolatile memory cells.

The write/read control circuit 6 is explained with reference to FIG. 3, and it determines, based on the chip-select signal CS input from the external terminal P1 and signals output from the AND gates G2 and G3, the operation of either writing to, or reading from, the memory-cell array 5. The write/read control circuit 6 outputs a control signal to the latch circuit 7 via the AND gate G4. A standby signal STB5 is input to either of the inputs of the AND gate G4. Accordingly, when the standby signal STB5 is in low level, the output of the AND gate G4 is in low level, and when it is in high level, the output of the AND gate G4 is equivalent to an output signal from the write/read control circuit 6.

Returning to FIG. 2, based on a control signal from the write/read control circuit 6, the latch circuit 7 outputs data read from the memory-cell array 5, which is output from the input/output control circuit 8, after holding the data for a predetermined time. The latch circuit 7 performs either a latch operation or a through operation in accordance with the output of the write/read control circuit 6. When the output of the write/read control circuit 6 is in low level, the latch circuit 7 performs the latch operation, and when the output of the write/read control circuit 6 is in high level, the latch circuit 7 performs the through-operation. The latch operation is an operation that maintains an output state. The through-operation is an operation that directly sends an input signal as an output signal.

The input/output control circuit 8 writes data input from the external terminal P6 to the memory-cell array 5, and, in reverse, outputs data read from the memory-cell array 5 to the external terminal P6 via the latch circuit 7.

The AND gate G1 outputs, to the address counter 2 and the AND gates G2 and G3, a signal as a logical multiplication of the chip-select control signal CS input from the external terminal P1 and a clock input signal CK input from the external terminal P2.

The AND gate G2 outputs a signal as a logical multiplication of an output signal from the AND gate G1 and a write/read input signal W/R from the external terminal P3. This signal is the above data-writing request signal WR. The data-writing request signal WR is input to the write/read control circuit 6. The data-writing request signal WR is also input as a write-control signal to the input/output control circuit 8 via the write-inhibit circuit 10. In addition, the AND gate G3 outputs, to the write/read control circuit 6, a signal as a logical multiplication of the output signal from the AND gate G1 and an inverted signal of the write/read input signal W/R.

Specifically, when the input signal from the AND gate G1 is "L", the outputs of the AND gates G2 and G3 are both "L". Also, when the input signal from the AND gate G1 is "H", if the write/read input signal W/R is "H", the output of the AND gate G3 is "L". Conversely, when the write/read input signal W/R is "L", the output of the AND gate G2 is "L", so that the output of the AND gate G3 is "H". As described, the AND gates G2 and G3 are designed so that their outputs are not unstable even if the write/read input signal W/R changes.

The external terminal P1 is a terminal for inputting the chip-select signal CS as a control signal for selecting a particular device when a plurality of devices exist simultaneously, for initialization of the address counter 2, and for transfer of the operating mode. In other words, the external terminal P1 in this embodiment is a terminal used both as a control terminal for address-counter initialization and as an operating-mode control terminal.

The external terminal P2 is a terminal for inputting the clock signal CK, which is a reference used when the semiconductor integrated circuit 1 operates. The external terminal P3 is a terminal for inputting the write/read input signal W/R, which designates the operation of accessing the memory-cell array 5 built into the semiconductor integrated circuit 1.

The external terminals P4 and P5 are input terminals for applying the operating voltages of the high potential power supply VDD and the low potential power supply VSS for the operation of the semiconductor integrated circuit 1. The external terminal P6 is an input/output terminal for inputting data to be actually written into the memory-cell array 5 built into the semiconductor integrated circuit 1 and for outputting data read from the memory-cell array 5.

In the above-described construction, when the voltage level of the high potential power supply VDD is normal, write inhibition by the write-inhibit circuit is not performed, as described above. Accordingly, in this case, the data-writing request signal WR is unchanged and output as the write-control signal WRITE, and writing of predetermined data is performed.

Conversely, when the voltage level of the high potential power supply VDD decreases, the write-control signal WRITE can be set to be at "L" irrespective of whether the data-writing request signal WR is at "H" or "L". This can inhibit miswriting.

Figure 3:
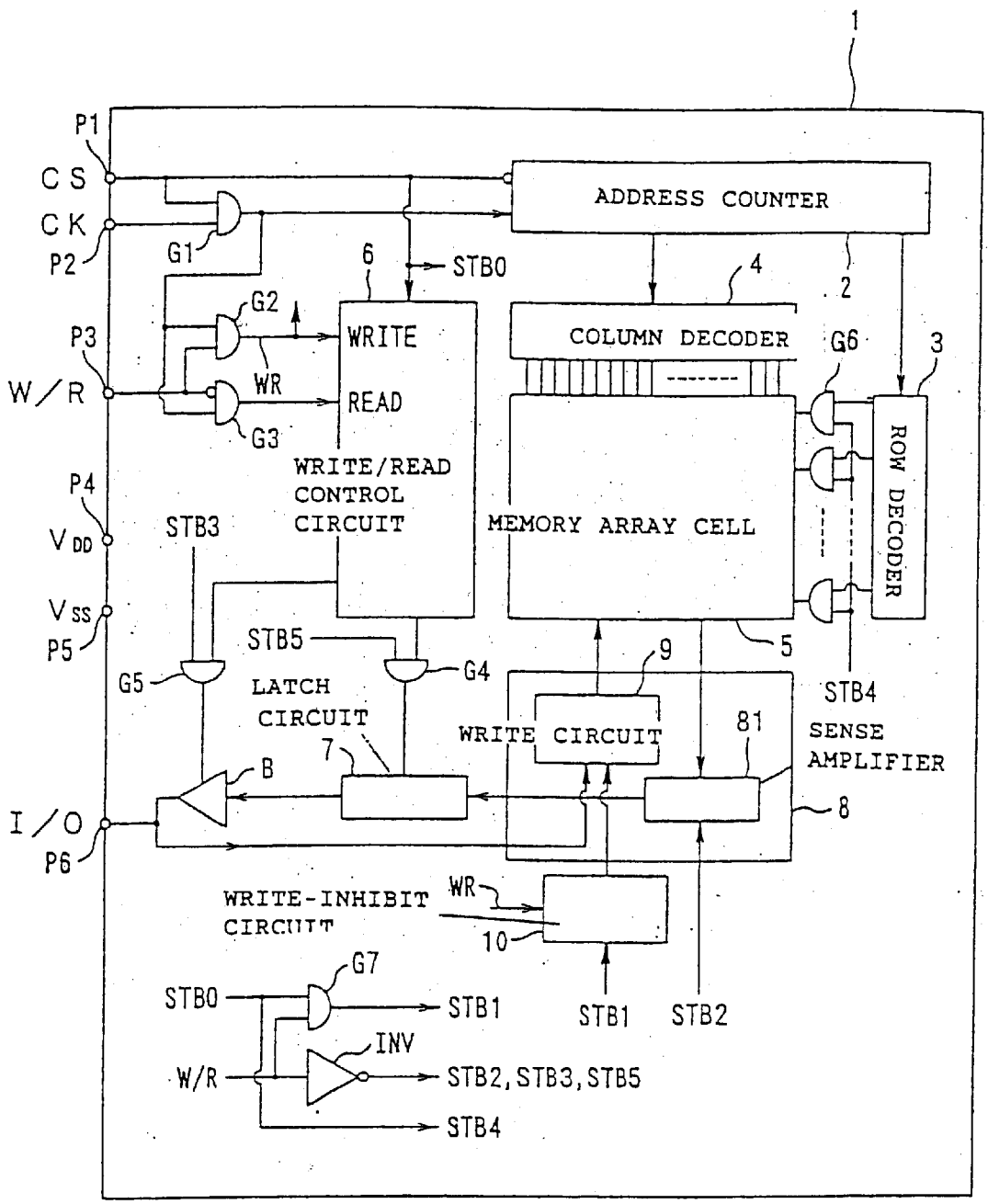
FIG. 3 is a functional block diagram illustrating the internal structure of another semiconductor integrated circuit.

In order to reduce the power consumption, the semiconductor integrated circuit 1 shown in FIG. 3 may be employed. In the semiconductor integrated circuit 1 shown in this figure, AND gates, etc., are added, and a reduction in the power consumption is achieved by terminating the operation of the internal circuit in accordance with their outputs. In this figure, the semiconductor integrated circuit 1 is obtained by adding, to the structure of FIG. 2, AND gates G4 to G7, a buffer B controlled to be in enable state or high impedance (Hi-Z) state by the write/read control circuit 6, a voltage-detection circuit 9, and an inverter INV.

The output lines of the row decoder 3 are provided with the AND gates G6, respectively, and a standby signal STB4 is input to either of the inputs of each AND gate G6. Thus, when the standby signal STB4 is in low level, no row of memory cells in the memory-cell array 5 is selected.

The write/read control circuit 6 outputs a control signal to a latch circuit 7 via the AND gate G4. A standby signal STB5 is input to either of the inputs of the AND gate G4. Accordingly, when the standby signal STB5 is in low level, the output of the AND gate G4 is in low level, and when it is in high level, the output of the AND gate G4 is equivalent to the output signal of the write/read control circuit 6.

The latch circuit 7 performs either of a latch operation and a through operation in accordance with the output of the AND gate G4. When the output of the AND gate G4 is in low level, the latch circuit 7 performs the latch operation, and when the output of the AND gate G4 is in high level, the latch circuit 7 performs the through-operation.

The buffer B is provided between the output of the latch circuit 7 and the external terminal P6. The buffer B is in enable state or high impedance state in accordance with an output from the AND gate G5 to which the standby signal STB3 and a control signal from the write/read control circuit 6 are input. When the standby signal STB3 as an output is in low level, the output of the AND gate G5 is in low level, and when it is in high level, the output of the AND gate G5 is equivalent to the output signal of the write/read control circuit 6. When the output of the AND gate G5 is in high level, and the buffer B is in enable state, the output of the latch circuit 7 is lead from the external terminal P6. Conversely, when the buffer B is in high impedance state, a signal given to the external terminal P6 is input to the input/output control circuit 8.

The input/output control circuit 8 includes a sense amplifier 81 that is operated by the standby signal STB2, and a write circuit 9 that performs writing to a memory-cell array 5 in accordance with an output from the write-inhibit circuit and an input/output signal I/O.

The write-inhibit circuit 10 has a function of controlling the write circuit 9 in the input/output control circuit 8 in accordance with the voltage levels of the data-writing request signal WR and the standby signal STB1. In a case in which this semiconductor integrated circuit is provided in an ink cartridge, data written in the memory-cell array 5 is, for example, the remaining amount of ink. By writing the remaining amount of ink, the remaining amount of ink can be always monitored.

The above standby signals STB1 to STB5 are generated by the AND gate G7 and the inverter INV. The standby signal STB1 is generated by the AND gate G7, which outputs a logical multiplication of the standby signal STB0 and the write/read input signal W/R. The standby signals STB2, STB3, and STB5 are generated by the inverter INV, which outputs an inverted signal of the write/read input signal W/R. The standby signal STB0 is unchanged and used as the standby signal STB4.

Figure 4:
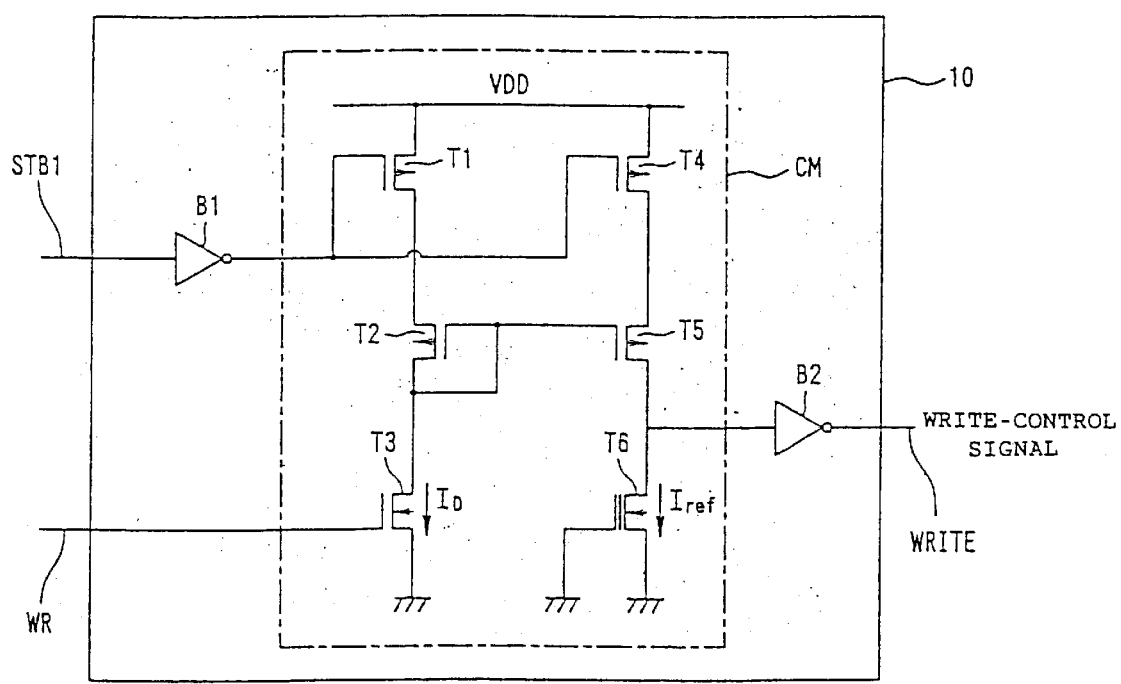
FIG. 4 is a circuit digital showing an example of a write-inhibit circuit used in the semiconductor integrated circuit in FIG. 3.

In the semiconductor integrated circuit shown in FIG. 3, the internal structure of the write-inhibit circuit 10 can be changed to that shown in FIG. 4. Referring to this figure, instead of inputting the data-writing request signal WR to the buffer gate B1, the standby signal STB1 is input to the buffer gate B1. Also in this structure, similarly to the case in the above FIG. 1, when the voltage level of the high potential power supply decreases, the write-control signal WRITE can be at "L" irrespective of whether the data-writing request signal WR is either "H" or "L". The can inhibit miswriting.

Next, the operation of the semiconductor integrated circuit shown in FIG. 3 is described with reference to FIG. 5 and FIG. 6.

Figure 5:
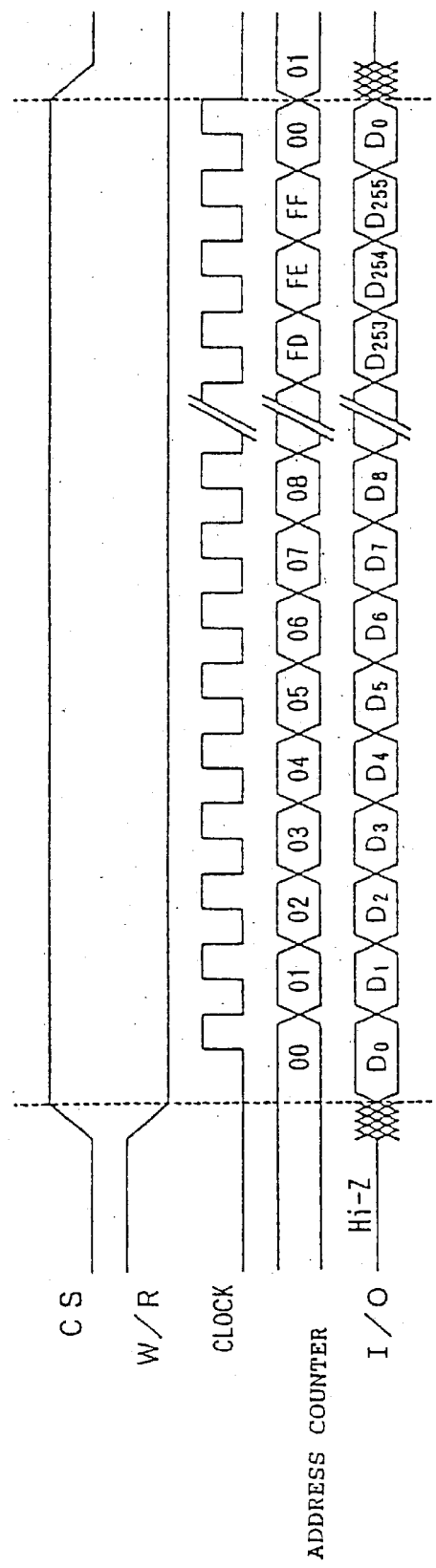
FIG. 5 is a timing chart illustrating the operation of reading with respect to a semiconductor integrated circuit.

FIG. 5 is a timing chart illustrating the operation of reading on the semiconductor integrated circuit. This figure shows the chip-select signal CS, the write/read input signal W/R, the clock CLOCK, the count value by the address counter 2, and the input/output signal I/O at the external terminal P6, which are in FIG. 1. When reading on the memory-cell array 5 is performed, by initially applying "L" to the external terminal P1, the address counter 2 is initialized. Next, "H" is applied to the external terminal P1, and clock pulses for a targeted read-start address are input from the external terminal P2. While the clock pulses are being input, "L" that designates reading is input as the write/read input signal W/R from the external terminal P3.

Data corresponding to the address is output in a period in which the clock signal CK is at "L", and is output from the external terminal P6. Since the data is latched in the latch circuit 7 in the rise of the clock pulses, its value is held in a period in which the clock signal CK is at "H". After the clock pulses rise, the address is incremented, and data at the next address is output from the external terminal P6.

Figure 6:
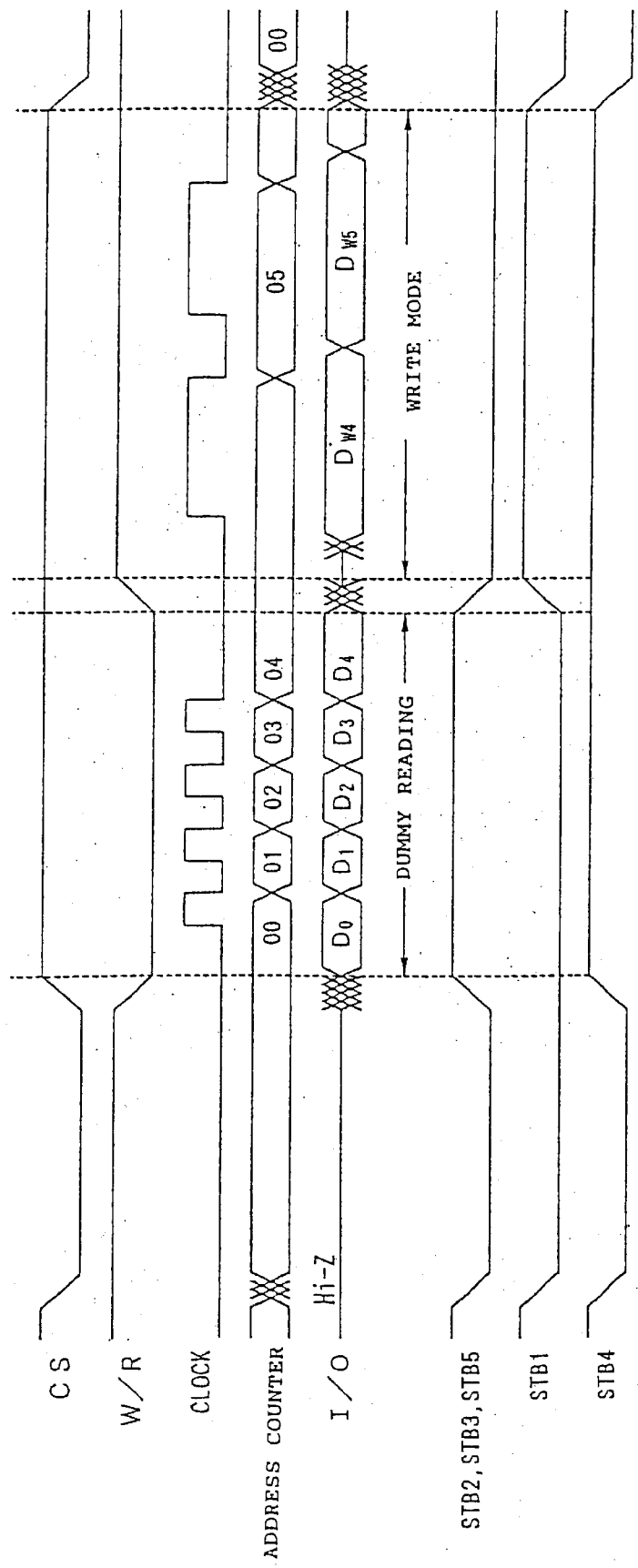
FIG. 6 is a timing chart illustrating a writing operation, etc., from a semiconductor integrated circuit.

FIG. 6 is a timing chart illustrating a writing operation, etc., from the semiconductor integrated circuit. This figure shows the standby signals STB1 to STB5 in addition to the chip-select signal CS, the write/read input signal W/R, the clock CLOCK, the count value by the address counter 2, and the input/output signal I/O at the external terminal P6. When writing to the memory-cell array 5 is performed, in a read mode, that is, a state in which the write/read input signal W/R is at "L", by initially applying "L" to the external terminal P1, the address counter 2 is initialized. Next, "H" is applied to the external terminal P1, and clock pulses for a targeted write-start address are input from the external terminal P2. After that, during the operation of writing, "H" that designates writing is applied as the write/read input signal W/R from the external terminal P3.

Next, a process in a case in which memory initialization and operating mode transfer are instructed is described. As described above, the application of "L" to the external terminal P1 initializes the address counter 2. This is an absolute required procedure for initializing the semiconductor integrated circuit, and is similar in the case of the write/read control circuit 6, etc., other than the memory-cell array 5. At this time, the output of the buffer B is in the Hi-Z state, and the external terminal P6 is open (in a high impedance state).

When printing by an ink-jet recording apparatus ends, "L" is input to the external terminal P1. This causes the standby signal STBO for operating mode transfer to be at "L", so that the operating mode of the semiconductor integrated circuit 1 is in a standby mode. When the operating mode of the semiconductor integrated circuit 1 is in the standby mode, a portion in which a current constantly flows is terminated so that reduction in the current consumption is achieved. Specifically, for example, it is common that the sense amplifier 81 provided in the input/output control circuit 8 is formed by a current mirror circuit. It is required that a current constantly flow in the sense amplifier 81. Accordingly, to reduce the current consumption, in the case of the standby mode, the standby signal STB2 is used to switch off a power-supply voltage supplied to the input/output control circuit 8. Similarly, the standby signal STBL is used to switch off the voltage-detection circuit 9, which is formed by a current mirror circuit.

In addition, the standby signal STB3 is used to set the buffer B as another internal circuit to be in high impedance state. The latch circuit 7 is controlled to be in latched state by the standby signal STB5. Address designation by the row decoder 3 is deterred by the standby signal STB4.

As described, in this embodiment, when the chip-select signal CS is at "L", that is, in a case in which the external terminal P1 is in a non-selected state, the address counter 2 is initialized and the semiconductor integrated circuit is in standby mode. These instructions are controlled by an input from the external terminal P1, which is used for another purpose, whereby reduction of external terminal reduction can be achieved while this embodiment has the memory initialization function and the function of transferring to the standby mode. Because the memory initialization control terminal and the operating mode control terminal are integrated into a common terminal, control thereof is also simplified.

The circuit block initialization and operating mode transfer functions may be modified such that, when a logical output of an input from the external terminal P1 and an input from another terminal is in non-selected state, the address counter 2 is initialized and the semiconductor integrated circuit 1 enters the standby mode.

Figure 7:
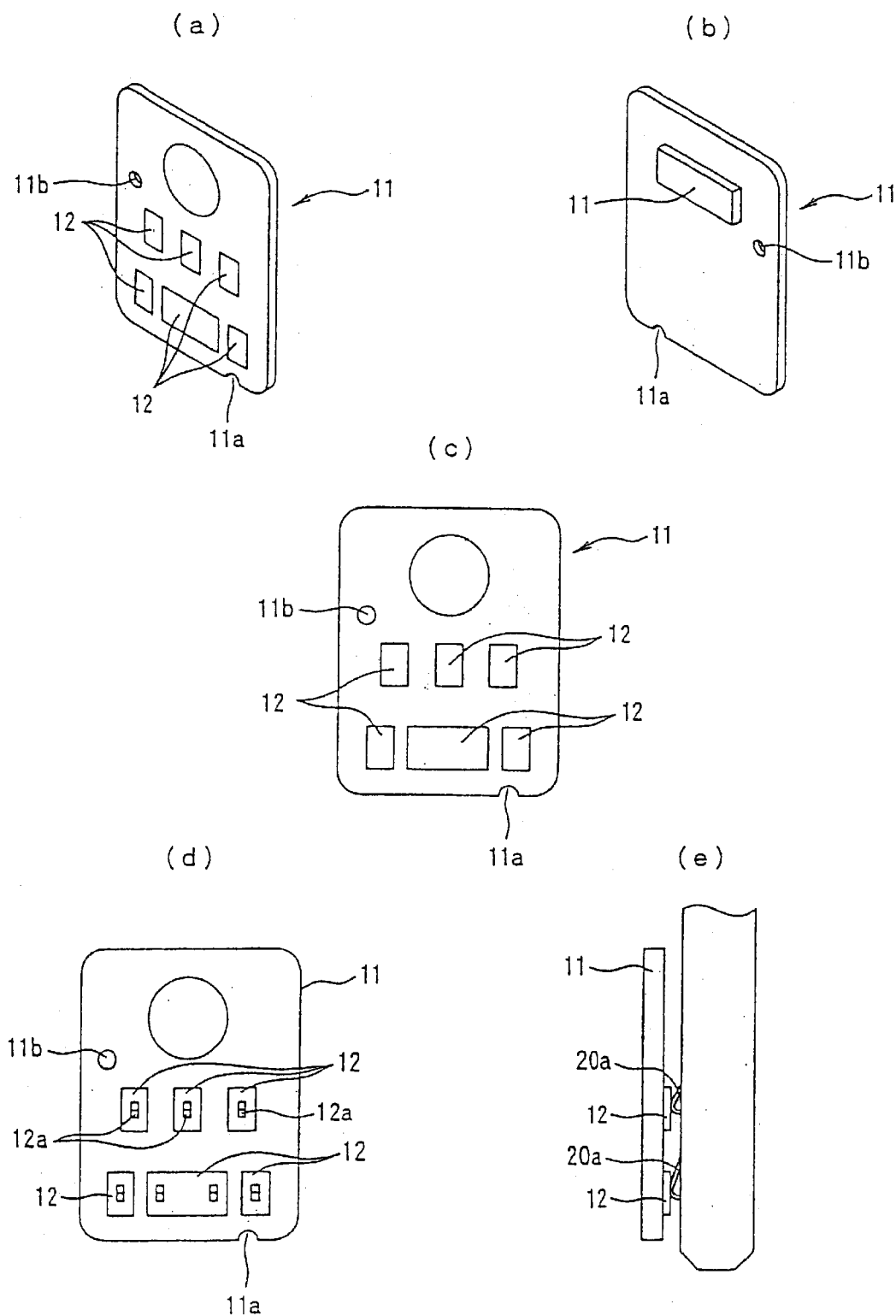
FIG. 7 is a drawing showing a circuit board on which the semiconductor integrated circuit shown in the embodiment is mounted.

In FIG. 7, (a) to (e) are illustrations of a circuit board on which a semiconductor integrated circuit according to this embodiment is mounted. As shown in (a) of this figure, a circuit board 11 has contacts formed on the surface thereof. These contacts 12 are connected to the above external terminals P1 to P6. Also, as shown in (b) of this figure, on the back surface of the circuit board 11, a semiconductor integrated circuit 1 is mounted.

As shown in (c) of this figure, the circuit board 11 has an approximately rectangular plate shape. The circuit board 11 is provided with a cut 11a and a hole 11b. These are used to determine the position of the circuit board 11 when it is mounted on an ink cartridge which is described later. As shown in (d) of this figure, on the surfaces of the contacts 12 provided on the circuit board 11, concave portions 12a may be provided. By providing the concave portions 12a, the state of electric connection to a contact 29 provided in the ink cartridge which is described later can be made preferable, as shown in (e) of this figure.

Figure 8:
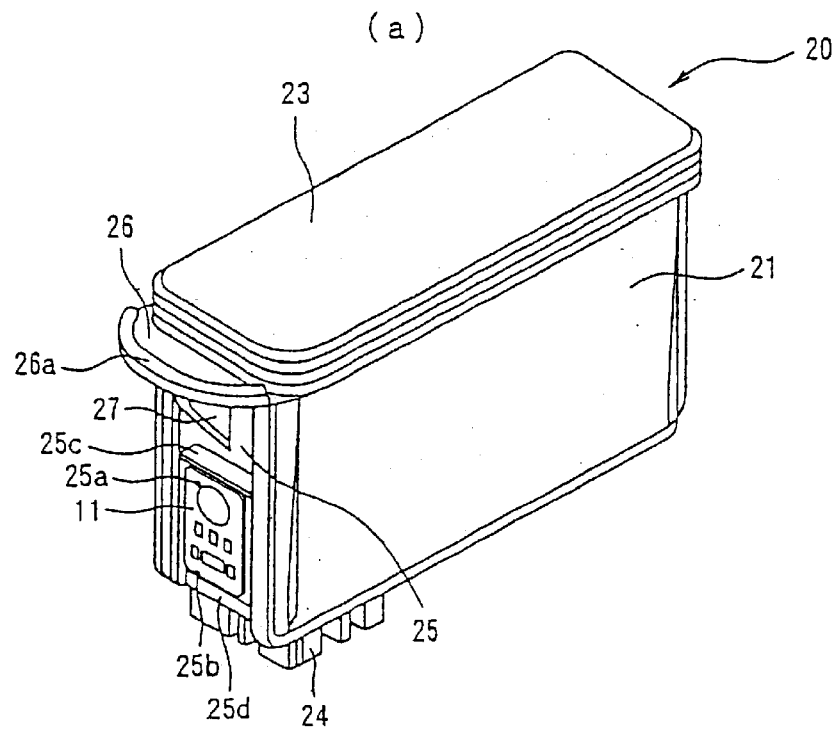
FIG. 8 is a drawing showing that the circuit board shown in FIG. 7 is mounted in an ink cartridge.
Figure 8:
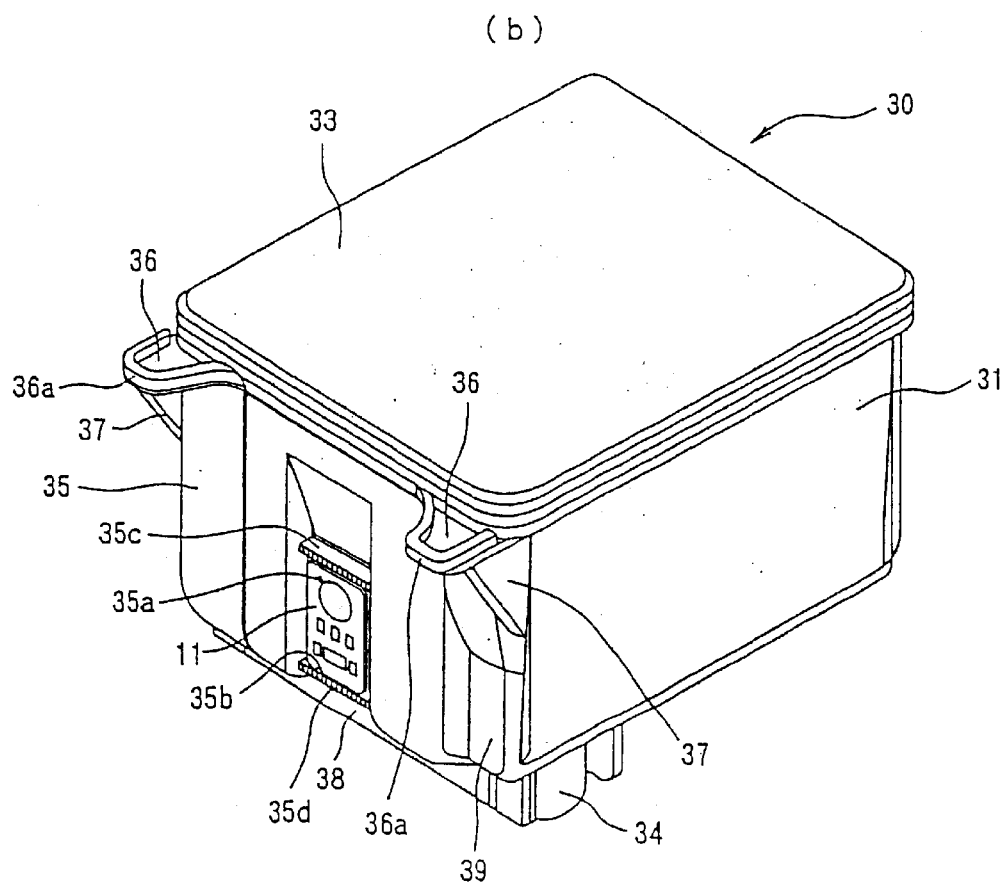

In FIG. 8, (a) and (b) are illustrations of the circuit board shown in FIG. 7 when it is mounted on the ink cartridge. In this figure, (a) shows that the circuit board 11 is mounted on a black ink cartridge 20 containing black ink. The black ink cartridge 20 contains a black-ink-impregnated porous material (not shown) in a container 21 formed almost as a rectangular parallelepiped, and its top surface is sealed by a cover member 23. On the bottom of the container 21, an ink-supply outlet 24 is formed at a position opposing an ink-supply needle when the container 21 is mounted on a holder. At the top end of a vertical wall 25 on the ink-supply outlet side, extended portions 26 that are engaged in a projection of a lever on the main unit side are formed in an incorporated form. The extended portions 26 are separately formed on both sides of the wall 25, and has a rib 26a. Between a lower area and the wall 25, a triangular rib 27 is formed.

On the ink-supply-outlet-formed side, the circuit board 11 is formed. The circuit board 11 has a plurality of contacts on a surface opposing contacts of the main unit, and a storage device mounted on the back of the surface. On the vertical wall 25, projections 25a and 25b, and extended portions 25c and 25d for determining the position of the circuit board 11 are formed.

In this figure, (b) shows that the mounted circuit board 11 is mounted in a color-ink cartridge 30 containing color ink. The color-ink cartridge 30 contains an ink-impregnated porous material in a container 31 formed almost as a rectangular parallelepiped, and its top surface is sealed by a cover member 31. Inside the container 51, five ink containers for separately containing five color inks are separately formed. On the bottom of the container 31, ink-supply outlets 34 corresponding to the ink colors are formed at positions opposing ink-supply needles. At the top end of a vertical wall 35, extended portions 36 that are engaged in lever projections of the main unit side are formed in an incorporated form. The extended portions 36 are separately formed on both sides of the wall 35, and have ribs 36a. Between a lower area and the wall 35, triangular ribs 37 are formed. Also, the container 35 has a concave portion 39 for preventing mis-insertion.

On the ink-supply-outlet-formed side on the vertical wall 35, a concave portion 38 is formed so as to be positioned in the center of the longitudinal direction of the cartridge 30, and the circuit board 11 is mounted thereon. The circuit board 11 has a plurality of contacts on a surface opposing contacts of the main unit, and on its back, a storage device is mounted. On the vertical wall 35, projections 35a and 35b and extended portions 35c and 35d for determining the position of the circuit board 11 are formed.

Figure 9:
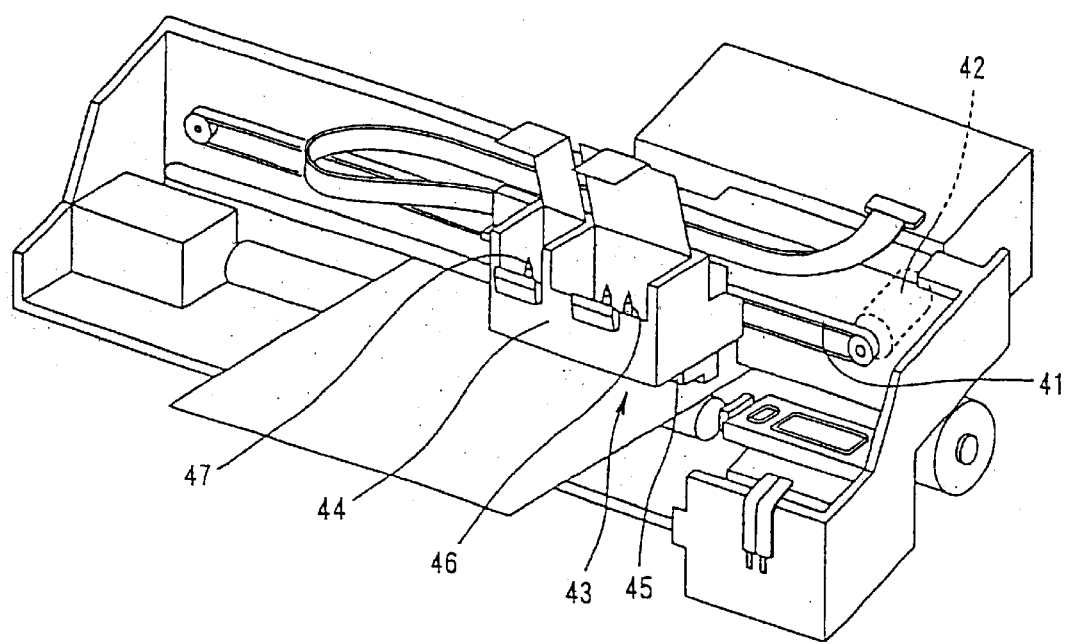
FIG. 9 is an illustration of an ink-jet printer in which the ink cartridge shown in FIG. 8 is mounted.

FIG. 9 is an illustration of the overview of an ink-jet printer (ink-jet recording apparatus) in which the ink cartridge shown in FIG. 8 is mounted. In this figure, in a carriage 43 connected to a driving motor 42 via a timing belt 41, a holder 44 is formed which contains the black ink cartridge 20 shown in (a) of FIG. 8, and the color-ink cartridge 30 shown in (b) of FIG. 8. Below the carriage 43, a recording head 45 to which ink is supplied from the each of the ink cartridges 20 and 30.

Ink-supply needles 46 and 47 that are linked to the recording head 45 are vertically provided on the bottom of the carriage 43 so as to be positioned in the back of the unit, that is, on the side of the timing belt 41.

Figure 10:
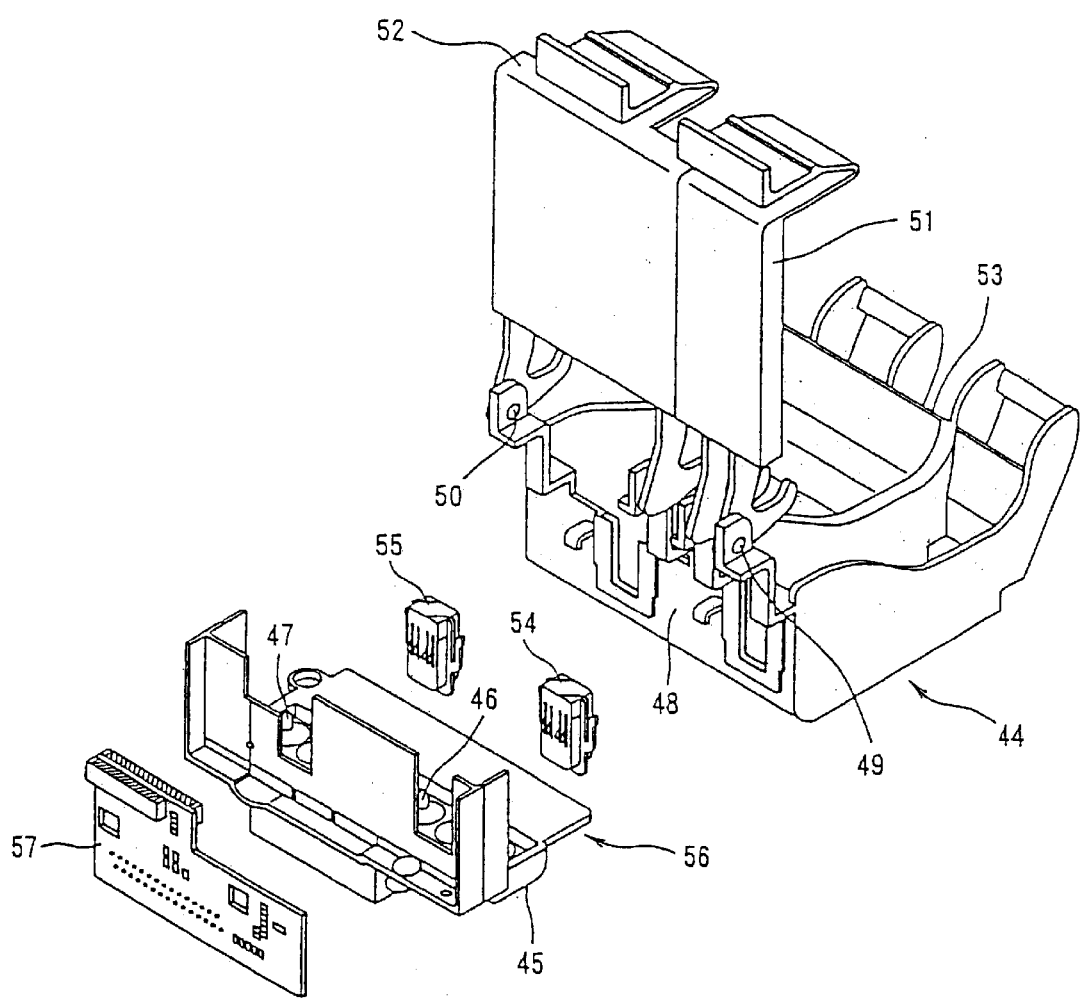
FIG. 10 is an illustration of the structure of the carriage shown in FIG. 9.

FIG. 10 is an illustration of the structure of the carriage shown in FIG. 9. As shown in this figure, among vertical walls forming the holder 44, at the top end of a vertical wall 48 opposing the vicinities of the ink-supply needles 46 and 46, levers 51 and 52 are provided using spindles 49 and 50 as fulcrums so as to rotate.

A wall 53, positioned on the free-end side of the levers 51 and 52, has an inclined surface portion. The vertical wall 48 is provided with contact mechanisms 54 and 55. The contact mechanisms 54 and 55 are electrically connected to the contacts provided on the above circuit board 11 when the cartridge is mounted. This makes it possible to use the ink in each ink cartridge to perform ink-jet recording.

A base 56 is provided to the vertical wall 48 of the holder 44. On the back of the base 56, a circuit board 57 is provided. Since the circuit board 57 is electrically connected to the contact mechanisms 54 and 55, the circuit board 11 and the circuit board 57, which are provided in the ink cartridge, are electrically connected to each other.

Figure 11:
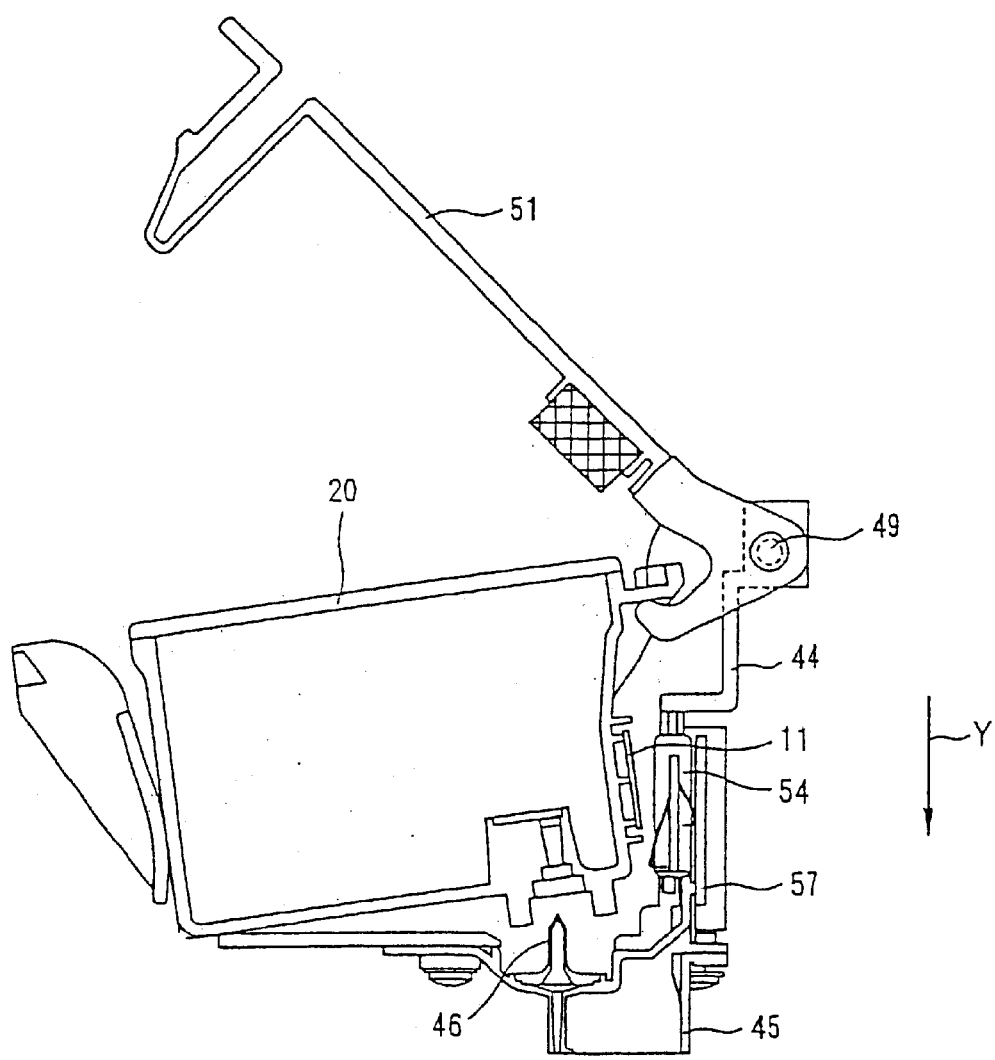
FIG. 11 is an illustration of a state before an ink cartridge is mounted in a holder.
Figure 12:
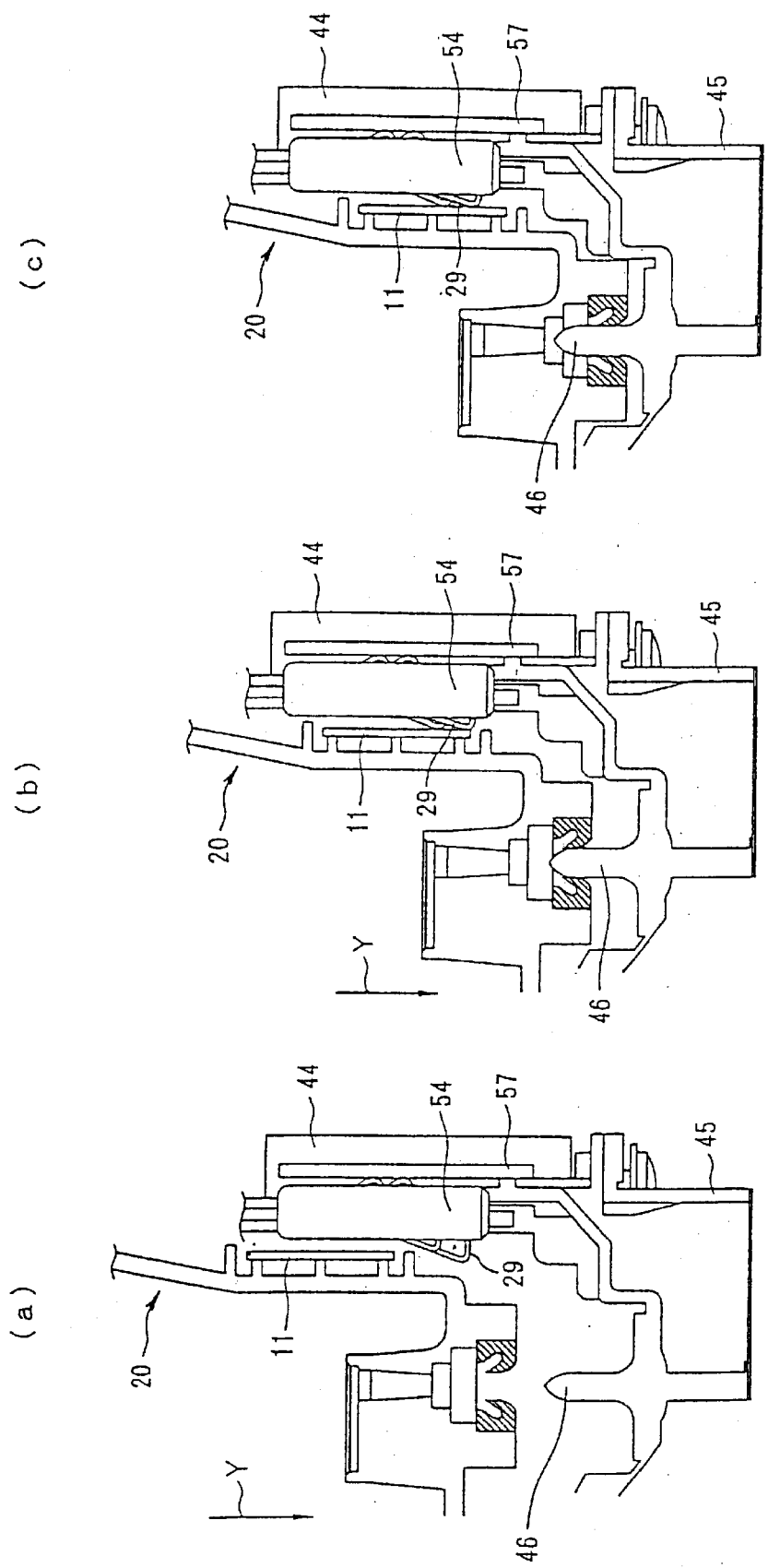
FIG. 12 is a drawing showing that an ink cartridge is mounted in a holder.

FIG. 11 is an illustration of a state obtained before mounting the ink cartridge in the holder, and in FIG. 12, (a) to (c) are illustrations showing that the ink cartridge is mounted in the holder. As shown in FIG. 11, when the lever 51 is lclosed while the ink cartridge 20 is mounted in the holder 44, the ink cartridge 20 is gradually lowered in the direction of the arrow Y. At this time, as the state shown in (a) of FIG. 12 transfers to the state shown in (c) of FIG. 12, the ink-supply needle 46 is inserted into the ink cartridge 20. When the ink-supply needle 46 is inserted into the ink cartridge 20, and the ink cartridge 20 is completely mounted in the holder 44, that is, in the state shown in (c) of FIG. 12, ink is supplied from the ink cartridge 20.

In the state shown in (c) of FIG. 12, the contact 12 provided on the circuit board 11, and the contact 29 on the circuit board 56 provided on the side of the holder 44 are electrically connected to each other. This enables the ink-jet printer to freely performing data reading/writing with respect to the semiconductor integrated circuit 1. Specifically, when the power supply of the printer is switched on, "L" is applied to the external terminal P1, and when the reading/writing operation is performed, "H" is applied. This can simplify logic, and can contribute to a reduction in the chip size.

Industrial Applicability

As described above, by using the write-inhibit circuit according to the embodiment, the circuit size can be reduced and the power consumption can be reduced, although the precision of detection is inferior to a case using an operational amplifier, whereby the write-inhibit circuit is the most suitable for provision to mass-produced products such as ink cartridges.

By using a semiconductor integrated circuit including the write-inhibit circuit in a ink cartridge, and performing control so that transfer to a low power consumption mode is performed in response to the termination of printing operation using the ink cartridge, the operating mode can be transferred without affecting the normal operation. In the low power consumption mode, by initializing a designated address, reduction in the power consumption can be achieved. Also, in the low power consumption mode, by terminating the operations of internal circuits such as a sense amplifier for generating a signal for reading stored data, an address decoder for designating an address, a buffer used when the read data is read, and a latch circuit for latching the read data, the power consumption can be further reduced.

In addition, by using, in common, terminals for instructing a circuit-block initializing function and the function of transferring to the standby mode, an external-terminal-reduced semiconductor integrated circuit is realized.

Moreover, by storing at least the remaining amount of ink in the ink cartridge, the remaining amount of ink can be always monitored.

What is claimed is:

1. A write-inhibit circuit comprising:

an input node for receiving a data-writing request signal;

an output node for outputting an output write-control signal to inhibit data writing;

a current mirror circuit having a first transistor array in parallel with a second transistor array between a high potential power supply and a low potential power supply, said first transistor array including a first plurality of series-connected transistors including a depletion transistor for generating a reference-current, said second transistor array including a second plurality of transistors and being effective for producing a signal current in response to the data-writing request signal received at said input node;

wherein the write-inhibit circuit is effective for providing an output signal at said output node indicative of a comparison between said reference current and said signal current when the voltage of said high potential power supply is not lower than a predetermined value, and when the voltage of said high potential power supply decreases below said predetermine value, the write-inhibit circuit is effective for providing a second output signal at said output node determined only by said reference current.

2. A write-inhibit circuit as set forth in claim 1, wherein:

the second transistor array is formed by connecting in series a first transistor which is connected to the high potential power supply and which is switched on in accordance with the data-writing request signal, a second transistor which allows a current equal to that flowing via the first transistor to flow in the first transistor array, and a third transistor which is switched on together with the first transistor and which forms a current path to the low potential power supply;

the first transistor array is formed by connecting in series a fourth transistor which is connected to the high potential power supply and which is switched on in accordance with the data-writing request signal, a fifth transistor having a gate electrode connected in common to the gate terminal of the second transistor, and a sixth transistor as the depletion transistor; and the write-control signal is output from the junction of the fifth transistor and the sixth transistor.

3. A semiconductor integrated circuit including:

a write-inhibit circuit as set forth in claim 1; a memory store of memory cells for storing data at a designated address; and an address generating circuit for sequentially generating addresses for designation in the memory store; wherein the writing of the data in the memory store is inhibited based on said write-control signal output from the write-inhibit circuit.

4. A semiconductor integrated circuit as set forth in claim 3, further including control means for performing control so as to perform transfer to a low power consumption mode having power consumption less than a normal operating mode for performing a normal operation, wherein the semiconductor integrated circuit is provided in an ink cartridge, and performs transfer to the low power consumption mode in response to the termination of a printing operation using the ink cartridge.

5. A semiconductor integrated circuit as set forth in claim 4, wherein the address is initialized when the control means performs transfer to the low power consumption mode.

6. A semiconductor integrated circuit as set forth in claim 5, wherein in the low power consumption mode activated by the control means, the operation of an internal circuit is terminated.

7. A semiconductor integrated circuit as set forth in claim 6, wherein the internal circuit is a sense amplifier for generating a signal in response to reading data stored in the memory store.

8. A semiconductor integrated circuit as set forth in claim 6, wherein the internal circuit is an address decoder for designating an address in the memory store.

9. A semiconductor integrated circuit as set forth in claim 6, wherein the internal circuit is a buffer used when data is read from the memory store.

10. A semiconductor integrated circuit as set forth in claim 6, wherein the internal circuit is a latch circuit for latching data read from the memory store.

11. A semiconductor integrated circuit as set forth in claim 4, wherein implementation of the transfer to the low power consumption mode and the initialization of the address generated by the address generating circuit is based on a control signal input to a common external terminal.

12. A semiconductor integrated circuit as set forth in claim 11, wherein the common external terminal is a chip-select terminal.

13. An ink cartridge including a semiconductor integrated circuit as set forth in claim 3, wherein a value of the remaining amount of ink in said ink cartridge is stored in said memory store.

14. An ink-jet recording apparatus having an ink cartridge as set forth in claim 13, wherein the ink-jet recording apparatus uses ink supplied from the ink cartridge to print image information.

* * * * *